(12) United States Patent
Kim (10) Patent No.: US 8,395,432 B2
(45) Date of Patent: Mar. 12, 2013

(54) CONTACTLESS ELECTRICAL POTENTIAL SENSOR CIRCUIT

(75) Inventor: Mincheol Kim, Daejon (KR)

(73) Assignee: Laxtha Inc., Daejeon (KR)

( * ) Notice: Subject to any disclaimer, the term of this patent is extended or adjusted under 35 U.S.C. 154(b) by 0 days.

(21) Appl. No.: 12/863,027

(22) PCT Filed: Sep. 4, 2009

(86) PCT No.: PCT/KR2009/005010
§ 371 (c)(1),
(2), (4) Date: Jul. 15, 2010

(87) PCT Pub. No.: WO2010/062026
PCT Pub. Date: Jun. 3, 2010

(65) Prior Publication Data
US 2011/0227607 A1    Sep. 22, 2011

(30) Foreign Application Priority Data

Nov. 25, 2008  (KR) .................. 10-2008-0117484
Feb. 3, 2009   (KR) .................. 10-2009-0008517

(51) Int. Cl.
*H03L 5/00*  (2006.01)

(52) U.S. Cl. ......................................... 327/307; 330/9

(58) Field of Classification Search .................. 327/307; 330/9
See application file for complete search history.

(56) References Cited

U.S. PATENT DOCUMENTS

| | | | |
|---|---|---|---|
| 6,573,785 B1 * | 6/2003 | Callicotte et al. | 330/9 |
| 6,963,237 B2 * | 11/2005 | Tamura et al. | 327/292 |
| 7,071,780 B2 * | 7/2006 | Van Zanten | 330/258 |
| 7,348,838 B2 * | 3/2008 | Ranganathan et al. | 329/320 |
| 7,795,960 B2 * | 9/2010 | Lyden et al. | 330/9 |
| 2006/0175540 A1 | 8/2006 | Tsuruhara | |

FOREIGN PATENT DOCUMENTS

| | | |
|---|---|---|
| JP | 1999-506541 | 6/1995 |
| JP | 2006-033091 | 7/2004 |
| KR | 10-2004-0058317 | 7/2004 |
| KR | 10-2005-0106869 | 11/2005 |
| WO | WO 2010/062026 | 3/2010 |

OTHER PUBLICATIONS

International Search Report for PCT/KR 2009/005010 dated Apr. 13, 2010.

* cited by examiner

*Primary Examiner* — Kenneth B. Wells
(74) *Attorney, Agent, or Firm* — Jenkins, Wilson, Taylor & Hunt, P.A.

(57) ABSTRACT

The present invention provides a sensor circuit. The sensor circuit comprises a first amplifier which receives a measurement signal via an input end thereof, amplifies the received signal, and outputs the amplified signal via a first output end thereof; a first current source which supplies current (Ir) flowing toward the input resistance (Ri) of the first amplifier; a second current source which supplies current (Ic) flowing toward the input capacitance (Ci) of the first amplifier; and a bias current source which reduces the direct current offset voltage in the output of the first amplifier.

17 Claims, 7 Drawing Sheets

CONTACTLESS ELECTRICAL POTENTIAL SENSOR CIRCUIT

CROSS-REFERENCE TO RELATED APPLICATIONS

This U.S. non-provisional patent application claims priority under 35 U.S.C. §119 to Korean Patent Application No. 10-2008-0117484, filed on Nov. 25, 2008, and Korean Patent Application No. 10-2009-0008517, filed on Feb. 03, 2009, the entirety of which is hereby incorporated by reference.

FIELD OF THE INVENTION

The present invention relates to sensor circuits and, more particularly, to an electrical potential sensor circuit.

BACKGROUND OF THE INVENTION

When an impedance of a signal source in an electrical signal is high, an input impedance of an amplifier must be considerably high to measure an electrical signal without loss. High input impedance amplifiers have been developed for signal measurement in an electrical signal measurement field. In the case that the amplifier is an operational amplifier, an input impedance of a sensor circuit is nearly decided by a self input impedance of the operational amplifier. Especially, because an input impedance of an operational amplifier used in electrical signal measurement is an input impedance of a sensor circuit, other circuit elements are almost not available as impedance rising elements. In conventional electrical signal measurement, an electrical signal can be sufficiently measured only with a self input impedance of an amplifier without loss.

In bioelectrical signal measurement, an electrolyte-containing metal electrode is attached to the skin of an examinee to measure an electrical signal. The electrolyte electrode attached to the skin of an examinee may cause the examinee to feel displeasure and inconvenience of a measurement procedure. Inconvenience of a measurement procedure and the examinee's displeasure serve as an obstacle to drastic demand for utilization of a bioelectrical signal.

SUMMARY OF THE INVENTION

The present invention provides a potential sensor circuit which is capable of measuring an electric potential of a signal source without physical and/or electrical contact with a voltage signal source.

Embodiments of the present invention provide a sensor circuit. According to example embodiments of the present invention, the sensor circuit may include a first amplifier receiving a measurement signal with an input terminal, amplifying the received signal, and providing the amplified signal to a first output terminal of the first amplifier; a first current source providing current flowing to a self input resistor of the first amplifier; a second current source providing current flowing to a self input capacitor of the first amplifier; and a bias current source removing a DC offset voltage appearing at an output of the first amplifier.

According to an example embodiment, the sensor circuit may further include at least one of a measurement electrode capacitively coupled to a measurement target having an electric potential; a coupling capacitor coupled in series between the measurement electrode and the input terminal; and a guard unit surrounding the periphery of the coupling capacitor and/or the measurement electrode and maintained at a voltage of the measurement signal.

According to an example embodiment, a gain of the first amplifier is 1 or greater.

According to an example embodiment, the sensor circuit may further include a measurement electrode capacitively coupled to a measurement target having an electric potential; a coupling capacitor coupled in series between the measurement electrode and the input terminal; and a guard unit surrounding the periphery of the coupling capacitor and/or the measurement electrode and maintained at a voltage of the measurement signal.

According to an example embodiment, a surface of the measurement electrode may be coated with an insulator.

According to an example embodiment, a capacitance of the coupling capacitor may be smaller than an equivalent capacitance between the measurement target and the measurement electrode.

According to an example embodiment, the first current source may increase an equivalent input resistance of the sensor circuit.

According to an example embodiment, the second current source may decrease an equivalent input capacitance of the sensor circuit.

According to an example embodiment, the bias current source may provide a stable operation of the first amplifier.

According to an example embodiment, the first current source may include a non-inverting amplifier circuit and the first current source builds one positive feedback of the sensor circuit.

According to an example embodiment, the second current source may include a differentiation circuit and a non-inverting amplifier circuit, and the second current source builds the other positive feedback of the sensor circuit.

According to an example embodiment, the bias current source may include an integration circuit and an inverting amplifier circuit, and the bias current source builds a negative feedback of the sensor circuit.

According to an example embodiment, the first current source may include a feedback resistor placed between the input terminal and a second node; a second amplifier with a second output terminal connected to the second node; a first resistor placed between a second negative input terminal and a ground; and a second resistor placed between the second node and the second negative input terminal of the second amplifier, wherein a second positive input terminal of the second amplifier is connected to the first output terminal of the first amplifier.

According to an example embodiment, the second current source may include a feedback capacitor placed between the input terminal and a third node; a third amplifier with a third output terminal connected to the third node; a third resistor placed between the third negative input terminal and a ground; and a fourth resistor placed between the third node and a third negative input terminal of the third amplifier, wherein a third positive input terminal of the third amplifier is connected to the first output terminal of the first amplifier.

According to an example embodiment, the bias current source may include a bias resistor placed between the input terminal and a fourth node; a fourth amplifier with a fourth output terminal connected to the fourth node; a capacitor placed between the fourth node and a fourth negative input terminal of the fourth amplifier; and a resistor placed between the fourth negative input terminal of the fourth amplifier and the first output terminal, wherein a fourth positive input terminal of the fourth amplifier is connected to a ground.

According to an example embodiment, the first amplifier may include at least one of an operational amplifier, a transistor amplifier circuit, and a field effect transistor amplifier circuit.

DETAILED DESCRIPTION OF THE EMBODIMENTS OF THE INVENTION

The present invention will now be described more fully hereinafter with reference to the accompanying drawings, in which preferred embodiments of the present invention are shown. However, the present invention may be embodied in many different forms and should not be construed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

Non-contact bioelectrical signal measurement without use of an electrolyte electrode is required to overcome disadvantages of an electrolyte-containing metal electrode. Due to the non-contact bioelectrical signal measurement, safety of an electric shock may be assured.

A sensor circuit according to an embodiment of the present invention may control input impedance of the sensor circuit. Thus, the sensor circuit may provide a circuit input impedance that is not highly dependent on a self input impedance of an amplifier used.

A sensor circuit according to an embodiment of the present invention may provide measurement of an electric potential signal without physical and electrical contact with a voltage signal source. For example, the sensor circuit may be used to measure a bioelectrical signal. In the case that an impedance of the voltage signal source is high, a voltage signal of the voltage signal source may be measured without loss when an input impedance of an amplifier of the sensor circuit is considerably high. In the case that an operational amplifier (OP AMP) is used as the amplifier, the input impedance of the sensor circuit may be nearly decided by a self input impedance of the operational amplifier. Particularly, an input impedance of the operational amplifier for use in a bioelectrical signal measurement field may be an input impedance of an amplifier of the sensor circuit. Thus, other circuit elements may make no contribution to the impedance of the sensor circuit. Conventionally, in a contact bioelectrical signal measurement field, an electrical signal may be sufficiently measured only with a self input impedance of the operational amplifier without loss.

The sensor circuit according to an embodiment of the present invention may measure electric potential from a voltage signal source generating a voltage without physical and electrical contact with the voltage signal source. The physical and electrical contactless may mean that a DC signal current does not flow between a measurement electrode and the voltage signal source. For example, a dielectric substance may be interposed between the voltage signal source and the measurement electrode.

[Physical Situation of Non-Contact Electric Potential Measurement]

Figure 1:
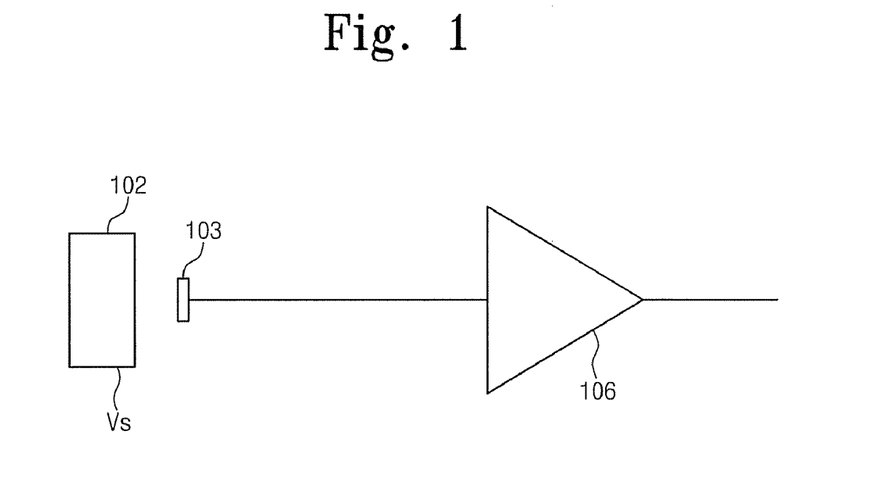
FIG. 1 illustrates an operation principle of a sensor circuit according to an embodiment of the present invention.
Figure 2:
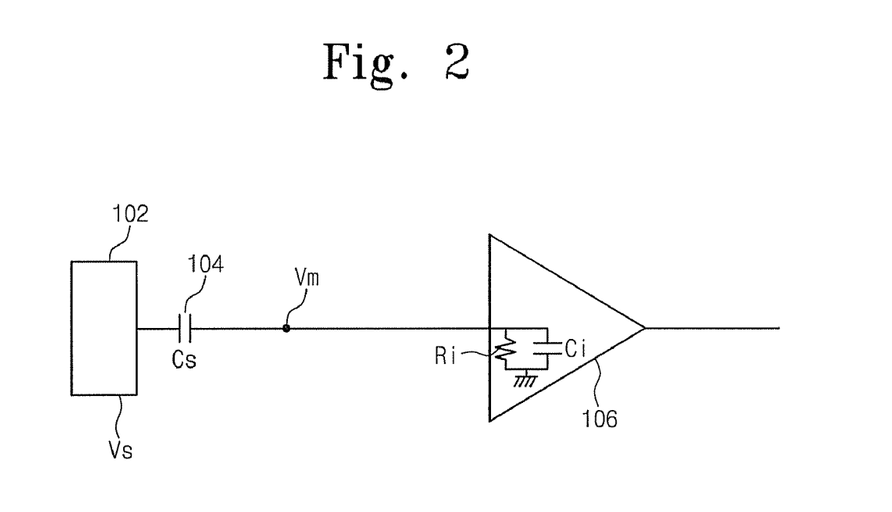
FIG. 2 is an equivalent circuit diagram of the sensor circuit shown in FIG. 1.

FIG. 1 illustrates an operation principle of a sensor circuit according to an embodiment of the present invention. FIG. 2 is an equivalent circuit diagram of the sensor circuit shown in FIG. 1, and FIG. 3 illustrates frequency characteristics of the sensor circuit shown in FIG. 2.

Figure 3:
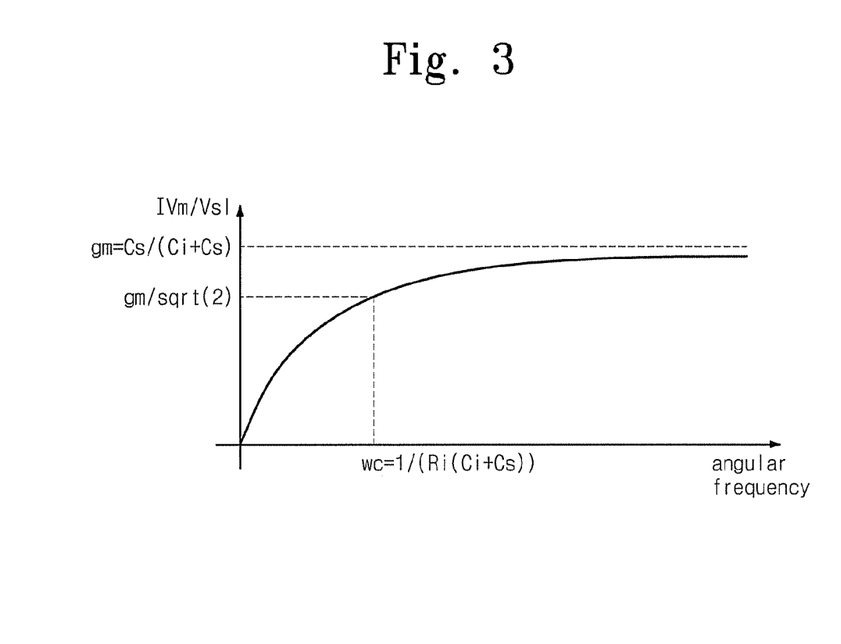
FIG. 3 illustrates frequency characteristics of the sensor circuit shown in FIG. 2.

Referring to FIGS. 1 to 3, electric potential $V_s$ of a voltage signal source 102 may be capacitive coupled with a measurement electrode 103 in a non-contact type. A measurement voltage $V_m$ or a measurement signal induced to the measurement electrode 103 may be measured through an amplifier 106 whose gain is A. Since the voltage signal source 102 and the measurement electrode 103 establish electrical capacitive coupling, the capacitive coupling may be expressed by an equivalent capacitor 104 having an equivalent capacitance $C_s$. The voltage signal source 102 and the amplifier 106 may be modeled with the equivalent capacitance $C_s$ and a self input resistance $R_i$ and a self input capacitance $C_i$ of the amplifier 106.

The amplifier 106 may amplify a measurement potential $V_m$ measured at the measurement electrode 103 as a gain A. The amplifier 106 may be an operational amplifier. Alternatively, the amplifier may comprise a transistor (TR) amplifier circuit and a field effect transistor (FET) amplifier circuit.

The measurement potential $V_m$ and the electric potential $V_s$ of the voltage signal source 102 may exhibit frequency characteristics, as follows:

$$\left|\frac{V_m}{V_s}\right| = \frac{\omega R_i C_S}{\sqrt{1 + [\omega R_i(C_i + C_S)]^2}} \qquad \text{Equation (1)}$$

wherein ω represents an angular frequency of the electric potential Vs of the voltage signal source 102. Considering the situation where the angular frequency is very high, equation (1) may be expressed as follows:

$$\left|\frac{V_m}{V_s}\right|_{max} = g_m = \frac{C_S}{C_i + C_S} \qquad \text{Equation (2)}$$

wherein $g_m$ represents the maximum value of the measurement potential $V_m$. Referring to equation (2), the $g_m$ may be dependent on the capacitance $C_s$ of the equivalent capacitor 104 and the self input capacitance $C_i$ of the amplifier 106. The self input capacitance $C_i$ of the amplifier 106 may have a predetermined value. The capacitance $C_s$ of the equivalent capacitor 104 may be dependent on a distance between the voltage signal source 102 and the measurement electrode 103.

Conventionally, the equivalent capacitance $C_s$ may have a value that is equal to or less than 1 pF. The self input capacitance $C_i$ of the amplifier 106 may be equal to about 10 pF. In this case, referring to equation (2), the measurement potential $V_m$, may be less than 1/10 of the electric potential $V_s$. Therefore, if the equivalent capacitance $C_s$ is low and the self input capacitance of the amplifier 106 is high, the $g_m$ is reduced to make it difficult to measure potential in a non-contact manner. Moreover, when signal frequency in bio-electrical signal is low, the value of the measurement potential $V_m$ is reduced further due to the frequency characteristics of equation (1), which makes the non-contact measurement more difficult. For the non-contact measurement, it is preferable that the equivalent capacitance $C_s$ is higher than the self input capacitance $C_i$ of the amplifier 106.

Referring to FIG. 3, the frequency characteristics of the measurement potential $V_m$ are identical to the output property of a high pass filter in terms of frequency dependency. A cut-off frequency ($w\omega_c$) of the high pass filter may be given as follows.

$$\omega_C = \frac{1}{R_i(C_i + C_S)} \quad \text{Equation (3)}$$

Referring to equation (3), if the equivalent capacitance $C_s$ is 1 pF and the self input capacitance $C_1$ of the amplifier is 10 pF, the self input resistance $R_i$ of the amplifier 106 corresponding to the cut-off frequency of 1 Hz is about 14 GΩ.

The cut-off frequency of about 0.1 Hz may be required to allow a signal of 1 Hz to pass the high pass filter without attenuation. Referring to equation (2), the input capacitance $C_i$ of the amplifier 106 may be preferably about 1/10 of the equivalent capacitance $C_s$ to reduce signal attenuation resulting from the equivalent capacitance $C_s$ and the self input capacitance $C_i$ of the amplifier 106. If the equivalent capacitance $C_s$ is considered to be about 1 pF, the self input capacitance of the amplifier 106 may be about 0.1 pF. Accordingly, referring to equation (3), the self input resistance $R_i$ of the amplifier 106 may be about 1.4 TΩ. Referring to equation (1), the measurement potential $V_m$ of 1 Hz may have a magnitude of 90 percent of the electric potential $V_s$ of the voltage signal source 102.

In case of a commercial operational amplifier having a conventional high input impedance, its self input resistance $R_i$ is about 1 TΩ and its self input capacitance $C_i$ is about 1 pF. Thus, it is difficult to use the commercial operational amplifier in non-contact potential measurement. As a result, for achieving a stable operation of a sensor circuit for measuring the electric potential $V_s$ of the voltage signal source 102 in a non-contact type, an equivalent input resistance of the sensor circuit may be preferably 100 TΩ or greater and an equivalent input capacitance thereof may be preferably 0.1 pF or less in spite of use of the commercial operational amplifier.

The design guide may be greatly changed with an equivalent capacitance $C_s$. Since decided design contents are preferably unchanged, there is a need to reduce an effect of the equivalent capacitance $C_s$.

[TO REDUCE OF AN EFFECT OF EQUIVALENT CAPACITANCE BETWEEN VOLTAGE SIGNAL SOURCE AND MEASUREMENT ELECTRODE]

A method for reducing an effect of electrical coupling between the voltage signal source 102 and the measurement electrode 103 on the sensor circuit will now be described below in detail.

Referring to equation (2), a maximum value of a measurement potential $V_m$ at an input terminal of the amplifier 106 may be decided by both the equivalent capacitance $C_s$ between the signal source 102 and the measurement electrode 103 and the self input capacitance $C_i$ of the amplifier 106. Once the self input capacitance $C_i$ of the amplifier 106 is decided by wiring of a circuit, the self input capacitance is nearly maintained without change. However, the equivalent capacitance $C_s$ may be changed in each situation by the relative configuration between the measurement electrode 103 and the signal source 102.

When the electric potential $V_s$ of the voltage signal source 102 is measured, it is required that the equivalent capacitance $C_s$ is unchanged. The measurement potential $V_m$ may result from the electric potential $V_s$ of the voltage signal source 102.

Figure 4:
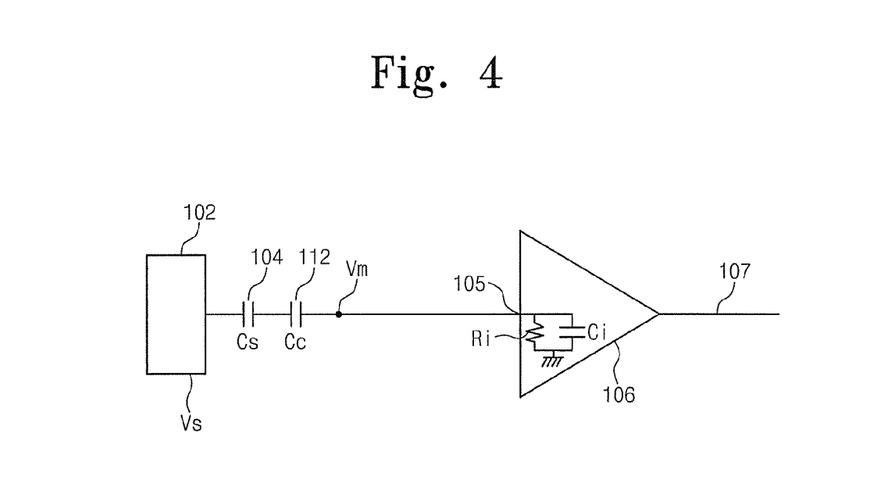
FIG. 4 is a circuit diagram of a sensor circuit according to another embodiment of the present invention.

FIG. 4 is a circuit diagram of a sensor circuit according to another embodiment of the present invention Referring to FIG. 4, a voltage signal source 102 and a measurement electrode 103 may provide an equivalent capacitor 104. A coupling capacitor 112 having a capacitance $C_c$ may be connected in series between the equivalent capacitor 104 and an input terminal 105 of an amplifier 106 to reduce variation of an equivalent capacitance $C_s$ based on a particular situation. The resultant total capacitance $C_t$ of the equivalent capacitor 104 and the coupling capacitor 112, which are connected in series, is always lower than individual capacitances of $C_s$ and $C_c$. If the capacitance $C_c$ of the coupling capacitor 112 is sufficiently lower than the capacitance $C_s$ of the equivalent capacitor 104, the total capacitance $C_t$ may be nearly equal to the capacitance $C_c$ of the coupling capacitor 112. The total capacitor $C_t$ may be expressed as follows:

$$C_t = \frac{C_S C_C}{C_S + C_C} \sim C_C \text{ for } C_S \gg C_C \quad \text{Equation (4)}$$

As can be seen in equation (4), if the coupling capacitor $C_c$ is sufficiently lower than the equivalent capacitance $C_s$, the total capacitance $C_t$ is nearly equal to the coupling capacitor $C_c$. That is, if the condition is established, a change in the capacitance $C_s$ on the measurement potential $V_m$ may be disregarded. Note that the variation in the capacitance $C_s$ may result from change in distance between the voltage signal source 102 and the measurement electrode 103.

For example, if the equivalent capacitance $C_s$ is about 1 pF, the coupling capacitance $C_c$, is about 0.1 pF to ignore equivalent capacitance $C_s$ dependency on the measuring potential $V_m$. In this case, the equivalent capacitance $C_s$ in equations (1) to (3) may be substituted with the total capacitance $C_t$ in equation (4). Under the condition that the total capacitance $C_t$ is nearly equal to the capacitance $C_c$ of the coupling capacitor 112, the equivalent capacitance $C_s$ in equations (1) to (3) may be substituted with the coupling capacitance $C_c$. Thus, the maximum measurement potential $V_m$ in equation (2) may be dependent on the capacitance $C_c$ of the coupling capacitor 112 and the self input capacitance $C_i$ of the amplifier 106.

[Sensor Circuit Having Extremely High Input Resistance and Extremely Low Input Capacitance]

Referring to the equation (2), if the coupling capacitance $C_c$ becomes about 0.1 pF by substituting the equivalent capacitance $C_s$ with the coupling capacitance $C_c$, the self input capacitance $C_i$ of the amplifier 106 is preferably 0.01 pF. In this case, referring to the equation (3), the self input resistance Ri of the amplifier 106 for having a cut-off frequency of 0.1 Hz may be about 14 TΩ. It is difficult to acquire a commercial operational amplifier which satisfies the above specification. Even in case of a commercial operational amplifier having a high input resistance, a conventional input resistance is about 1 TΩ and an input capacitance is about 1 pF. A sensor circuit having an input resistance of 100 TΩ or greater and an input capacitance of 0.01 pF or less should be constructed with an amplifier of the above specification. Theoretically, a sensor circuit having an infinite input resistance and a zero input capacitance is the most ideal sensor circuit.

A method for increasing an input resistance of a sensor circuit and decreasing an input capacitance thereof will now be described below.

Figure 5:
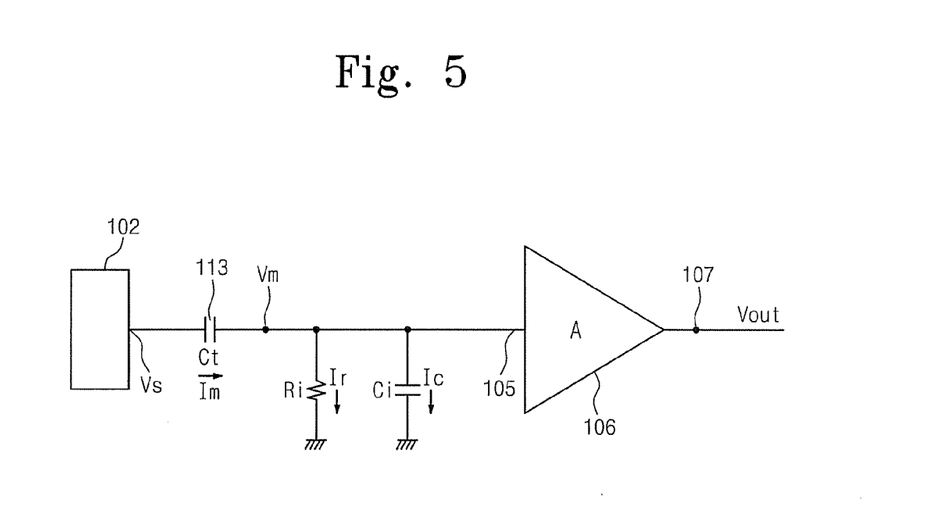
FIG. 5 is an equivalent circuit diagram of the sensor circuit shown in FIG. 4.

FIG. 5 is an equivalent circuit diagram of the sensor circuit shown in FIG. 4.

Referring to FIGS. 4 and 5, a total capacitance $C_t$ may be coupled between a voltage signal source 102 and an input terminal 105 of an amplifier 106. Measurement current $I_m$ may flow through a self input resistor $R_i$ and a self input capacitor $C_i$ of the amplifier 106 by electric potential $V_s$ of the voltage signal source 102. By the measurement current $I_m$, the measurement potential $V_m$ may be established at the input terminal 105 of the amplifier 106.

The measurement potential $V_m$ established at the input terminal 105 of the amplifier 106 may induce current $I_r$ flowing through the self input resistor $R_i$ of the amplifier 106 and current $I_c$ flowing through the self input capacitor $C_i$ of the amplifier. The currents $I_r$ and $I_c$ may be supplied by the voltage signal source 102.

When the measurement current $I_m$ supplied from the voltage signal source 102 becomes zero, the sensor circuit may have infinite input impedance. That is, the amplifier may have infinite input resistance and a zero input capacitance.

Even when the measurement current $I_m$ becomes zero, the measurement potential $V_m$ should have a value that is proportional to electric potential $V_s$ of the voltage signal source 102. In this case, currents $I_r$, $I_c$) based on Ohm's Law may flow through the self input resistor $R_i$ and the self input capacitor $C_i$ of the amplifier 106 respectively. Since the measurement current $I_m$ is zero (0), the currents ($I_r$, $I_c$) may be supplied by other current sources.

Figure 6:
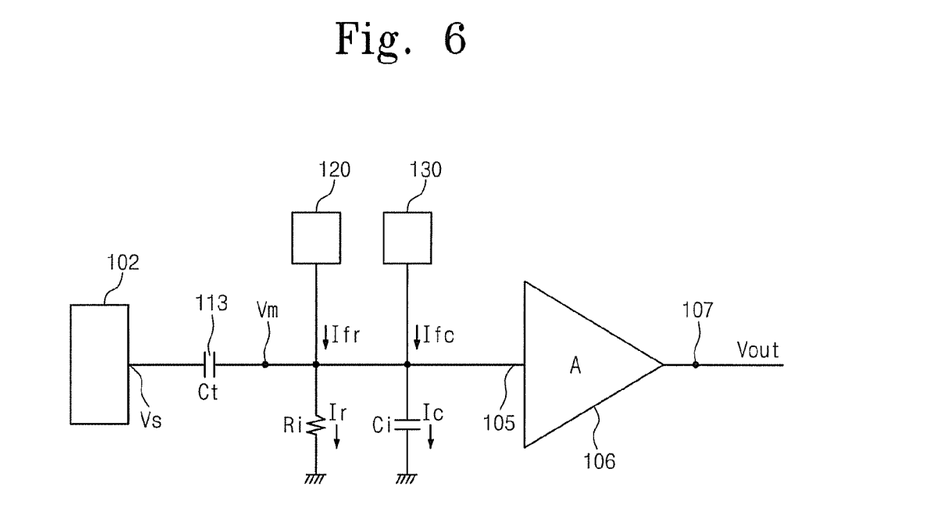
FIG. 6 is an equivalent circuit diagram of a sensor circuit according to another embodiment of the present invention.

FIG. 6 is an equivalent circuit diagram of a sensor circuit according to another embodiment of the present invention.

Referring to FIG. 6, the sensor circuit may include a first amplifier 106 amplifying a measurement signal or a measurement potential $V_m$ and providing the amplified signal or potential to a first output terminal 107, a first current source 120 supplying current $I_r$ flowing to a self input resistor $R_i$ of the amplifier 106, and a second current source 130 supplying current $I_c$ flowing to a self capacitor $C_i$ of the first amplifier 106.

The current $I_r$ flowing through the self input resistor $R_i$ of the first amplifier 106 may be supplied by output current $I_{fr}$ of the first current source 120. The current $I_c$ flowing through the self input capacitor $C_i$ of the first amplifier 106 may be supplied from the output current $I_{fc}$ of the second current source 130. If currents $I_{fr}$ and $I_{fc}$ flowing into the input terminal 105 of the first amplifier 106 have the same value as outflow current $I_r$ and $I_c$, the measurement potential $V_m$ of the input terminal 105 may be maintained at a specific value. As a result, even when there is no measurement current $I_m$ flowing to the first amplifier 106 from a voltage signal source 102, the measurement potential $V_m$ being in proportion to an electric potential $V_s$ of the voltage signal source 102 is established at the input terminal 105 of the first amplifier 106 to make an input impedance of the sensor circuit infinite. That is, an equivalent input resistance of the sensor circuit may be infinite and an equivalent input capacitance thereof may become zero. The first and second current sources 120 and 130 may be introduced to build the measurement potential $V_m$ while measurement current $I_m$ does not flow.

The first current source 120 may supply current $I_r$ flowing to the self input resistor $R_i$ of the first amplifier 106. In order to maintain the measurement potential $V_m$, output current $I_{fr}$ of the first current source 120 increases when the measurement potential $V_m$ increases and decreases when the measurement potential $V_m$ decreases. Similarly, the second current source 130 may supply current $I_c$ flowing through the self input capacitor $C_i$ of the first amplifier 106. In order to maintain the measurement potential $V_m$, output current $I_{fc}$ of the second current source 130 may increase when the measurement potential $V_m$ increases and decrease when the measurement potential $V_m$ decreases. The first and second current sources 120 and 130 may supply currents $I_{fr}$ and $I_{fc}$, respectively, which are in proportion to the measurement potential $V_m$, to an input terminal of the first amplifier 106.

The first amplifier 106 may amplify the measurement potential $V_m$ as a gain A. The first and second current sources 120 and 130 may form positive feedback loop. The output currents $I_{fr}$ and $I_{fc}$ of the first and second current sources rise when an output of the amplifier 106 rises.

Figure 7:
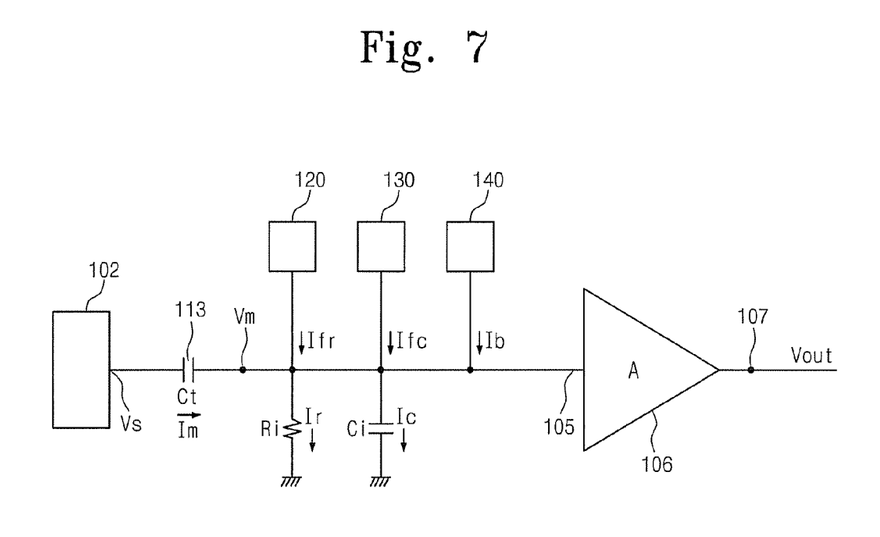
FIG. 7 is an equivalent circuit diagram of a sensor circuit according to another embodiment of the present invention.

FIG. 7 is an equivalent circuit diagram of a sensor circuit according to another embodiment of the present invention. In order to avoid duplicate explanations, the following explanations relate only to aspects that are different from FIG. 6.

Referring to FIGS. 6 and 7, in order to perform normal operations, the first amplifier 106 needs a path along which bias current existing at the input terminal 105 of the first amplifier 106 can flow. A bias current path through the self input resistor $R_i$ of the first amplifier 106 may be considered. However, because an offset voltage is built by the high self input resistor $R_i$ an output of the first amplifier 106 may be saturated, therefore the first amplifier 106 is prevented from performing normal operations. In the configuration of an amplifier, a bias current path may be considered by inserting a shunt resistor of low resistance into an input terminal. However, because a sensor circuit according to an embodiment of the present invention is configured to have a high input resistance, the shunt resistor of low resistance cannot be used.

Accordingly, a method for securing a bias current path with very high an input impedance of the sensor circuit will now be described below in detail.

A bias current source 140 to which bias current $I_b$ can flow may be connected to the input terminal 105 of the first amplifier 106. The bias current source 140 may absorb or release current according to a sign of the bias current $I_b$. Preferably, the bias current source 140 should not affect an equivalent input resistance and an input capacitance of the sensor circuit.

Operation property of the bias current source 140 supplying the bias current $I_b$ may be different from that of the first and second current sources 120 and 130. An operation of the bias current source 140 may be not decided by the measurement potential $V_m$. The output of bias current source 140 may be decided by the magnitude of a DC offset voltage existing at an output of the first amplifier 106. When a positive offset voltage is established at the output of the first amplifier 106, the bias current source 140 may operate to reduce the bias current $I_b$ such that a value of the positive offset voltage becomes zero. On the other hand, when a negative offset voltage is established at the output of the first amplifier 106, the bias current source 140 may operate to increase the bias current $I_b$ such that a value of the negative offset voltage becomes zero. As a result, the bias current source 140 may operate to supply the bias current $I_b$ in a reverse direction to the DC offset output of the first amplifier 106. An input of the bias current source 140 may be connected to the output of the first amplifier 106 to form negative feedback such that the DC offset voltage appearing at the output of the amplifier 106 becomes zero.

Figure 8:
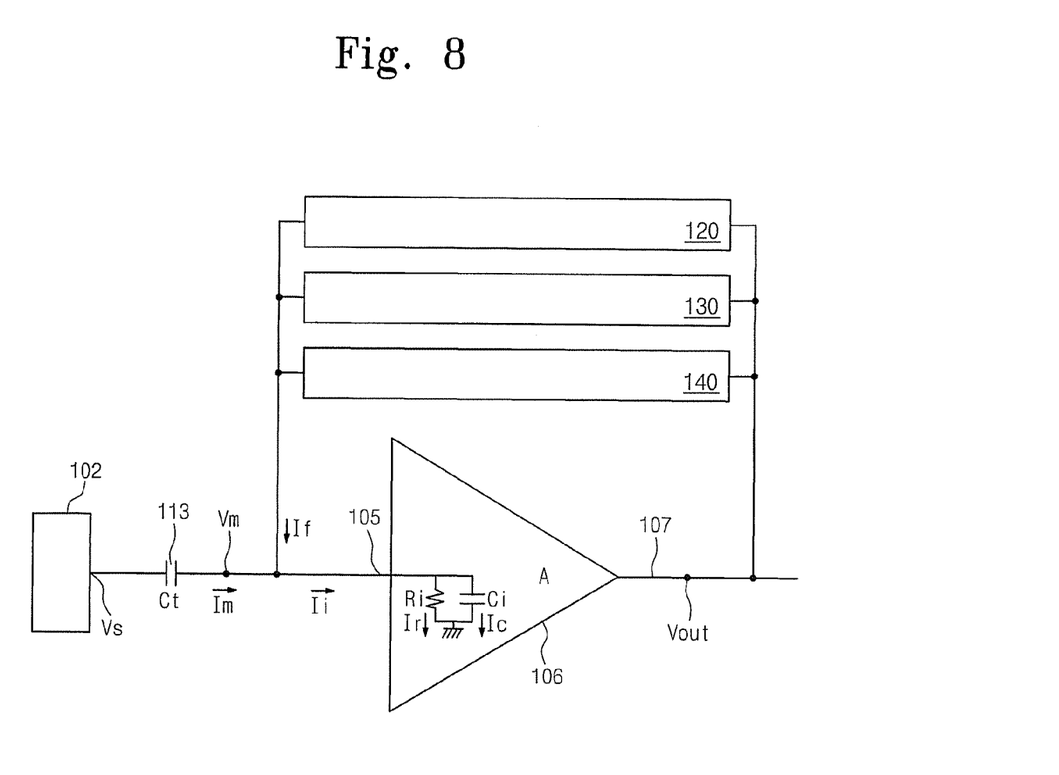
FIG. 8 is an equivalent circuit diagram of a sensor circuit according to another embodiment of the present invention.

FIG. 8 is an equivalent circuit diagram of a sensor circuit according to another embodiment of the present invention. A self input resistor $R_i$ and an self input capacitor $C_i$ of a first amplifier 106 are shown after returning to their original positions in the first amplifier 106.

Referring to FIG. 8, first and second current sources 120 and 130 and a bias current source 140 may each form feedback circuits receiving an output $V_{out}$ of a first amplifier 106 and providing feedback current $I_f$ to an input terminal 105 of the amplifier 106. Input current $I_i$ of the first amplifier 106 may be supplied by combining measurement current $I_m$ with feedback current $I_f$ at the input terminal 105 of the first amplifier 106.

The first current source 120 supplies current $I_r$ flowing to the self input resistor $R_i$ of the amplifier 106 and outputs current in proportion to the output $V_{out}$ of the amplifier 106. The first current source 120 may form one positive feedback circuit having a constant gain.

The second current source 130 may supply current $I_c$ flowing to the self capacitor $C_i$ of the first amplifier 106. The second current source 130 may output current obtained by differentiating the output $V_{out}$ of the amplifier 106. The second current source 130 may include a differentiation circuit and forms the other positive feedback of the sensor circuit.

The bias current source 140 may supply bias current $I_b$ to the input terminal 105 of the amplifier 106. The bias current source 140 may supply the bias current $I_b$ by integrating the output $V_{out}$ of the amplifier 106 such that a DC offset voltage existing at the output $V_{out}$ of the amplifier 106 becomes zero. The bias current source 140 may include an integration circuit and form a negative feedback loop of the sensor circuit.

Hereinafter, relationships between the first and second current sources and the bias current 140 and an input resistance and an input capacitance of the sensor circuit will now be described in detail.

A current equation associated with measurement signal obtained at the input terminal 105 of the amplifier 106 will be expressed as follows (self bias current existing at the amplifier 106 is disregarded for the brevity of explanation):

$$I_i = I_m + I_f \quad \text{Equation (5)}$$

wherein $I_i$ represents input current of an amplifier 106 which is supplied to an self input resistor $R_i$ and an self input capacitor $C_i$ of the amplifier 106, $I_m$ represents measurement current supplied to the sensor circuit by an electric potential $V_s$ of the voltage signal source 102, and $I_f$ represents feedback current supplied by the current sources 120, 130, and 140.

The currents $I_i$, $I_m$, and $I_f$ may be given as follows:

$$I_i = \left(i\omega C_i + \frac{1}{R_i}\right)V_m \quad \text{Equation (6)}$$

$$I_m = i\omega C_t(V_s - V_m)$$

$$I_f = \left(\alpha + i\omega\beta - \frac{\gamma}{i\omega}\right)V_{out}$$

$$V_{out} = AV_m$$

wherein i represents a complex number, ω represents an angular frequency of a measurement signal, α represents a proportional factor of the first current source 120, β represents a proportional factor of the second current source 130, γ represents a proportional factor of the bias current source 140, A represents a gain of the amplifier 106, $V_s$ represents an electric potential of the voltage signal source 102, and $V_m$ represents a measurement potential obtained at the input terminal 105 of the amplifier 106.

The proportional factors α, β, and γ have a reciprocal of resistance, a capacitance, and a reciprocal of inductance unit, respectively. If the Equation (6) is substituted into the equation (5), the following equation can be obtained.

$$\frac{V_m}{V_s} = \frac{i\omega C_t}{i\omega(C_t + C_i - A\beta) + \frac{1}{R_i} - A\alpha + \frac{A\gamma}{i\omega}} \quad \text{Equation (7)}$$

If the proportional factory γ is sufficiently smaller than the angular frequency ω, the last term of the equation (7) may be ignored. If so, the equation (7) may be given as follows:

$$\left|\frac{V_m}{V_s}\right| = \left|\frac{i\omega C_t}{i\omega(C_t + C_i - A\beta) + \frac{1}{R_i} - A\alpha}\right| \quad \text{Equation (8)}$$

$$= \left|\frac{\omega R_{ie} C_t}{\sqrt{1 + [\omega R_{ie}(C_{ie} + C_t)]^2}}\right|$$

If comparing the equations (1) and (8) with each other, the sensor circuit may be equivalent to the sensor circuit shown in FIG. 2 having an equivalent input resistance $R_{ie}$ and an equivalent input capacitance $C_{ie}$. As a result, an input resistance and an input capacitance of the amplifier may be adjusted by configuring the sensor circuit shown in FIG. 8. The equivalent input resistance $R_{ie}$ and the equivalent input capacitance $C_{ie}$ of the amplifier may be given as follows:

$$\frac{1}{R_{ie}} = \frac{1}{R_i} - A\alpha; \; C_{ie} = C_i - A\beta \quad \text{Equation (9)}$$

If the gain A of the amplifier 106, the proportional factor α of the first current source 120, and the proportional factor β of the second current source 130 are adjusted, the equivalent input resistance $R_{ie}$ of the amplifier may be infinite and the equivalent $C_{ie}$ thereof may become zero.

Figure 9:
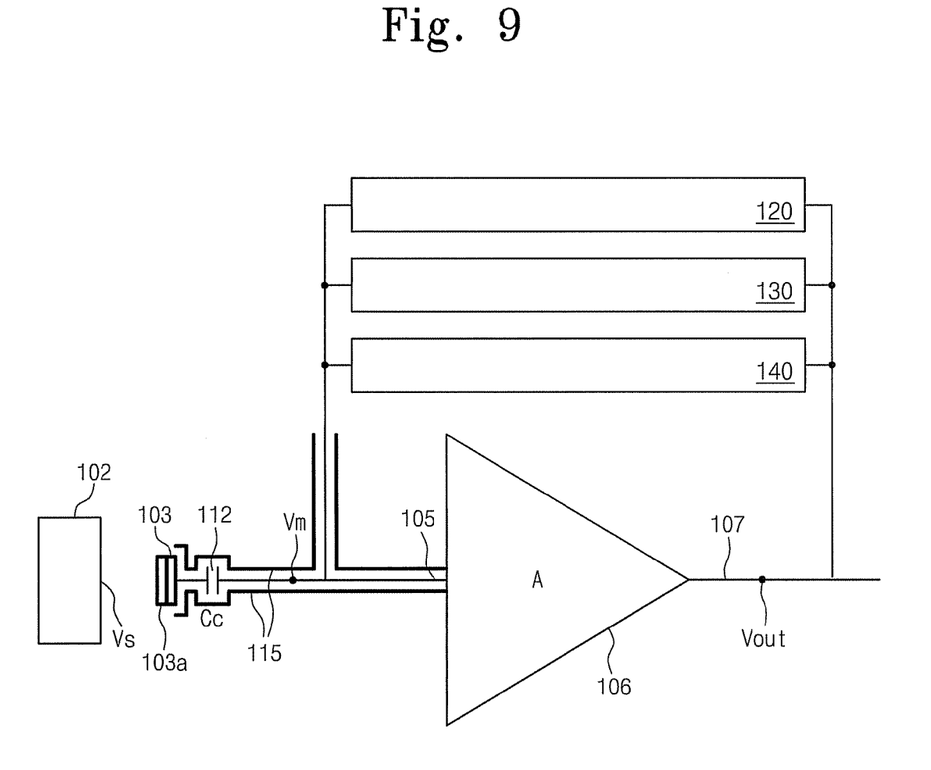
FIG. 9 is a block diagram of a sensor circuit according to another embodiment of the present invention.

FIG. 9 is a block diagram of a sensor circuit according to another embodiment of the present invention.

Referring to FIG. 9, the sensor circuit may be mounted on a printed circuit board (PCB). In this case, an interaction between signal lines, that is, the interaction between a measurement electrode 103 including the signal lines and a peripheral environment may have an influence upon the sensor circuit operation. A guard unit may be disposed at the periphery of an input terminal 105 of a first amplifier 106 including the measurement electrode 103 to reduce the influence. The guard unit may cut off a leakage current path formed between input signal line and a ground to provide a stable operation of the sensor circuit. The guard unit may be driven with the same potential as a measurement potential $V_m$ of the input terminal 105 of the first amplifier 106. A surface of the measurement electrode 103 may be coated with an insulator 103*a*. The guard unit may surround the periphery of a coupling capacitor 112 and/or the measurement electrode 103 and may be maintained at the measurement voltage $V_m$.

Figure 10:
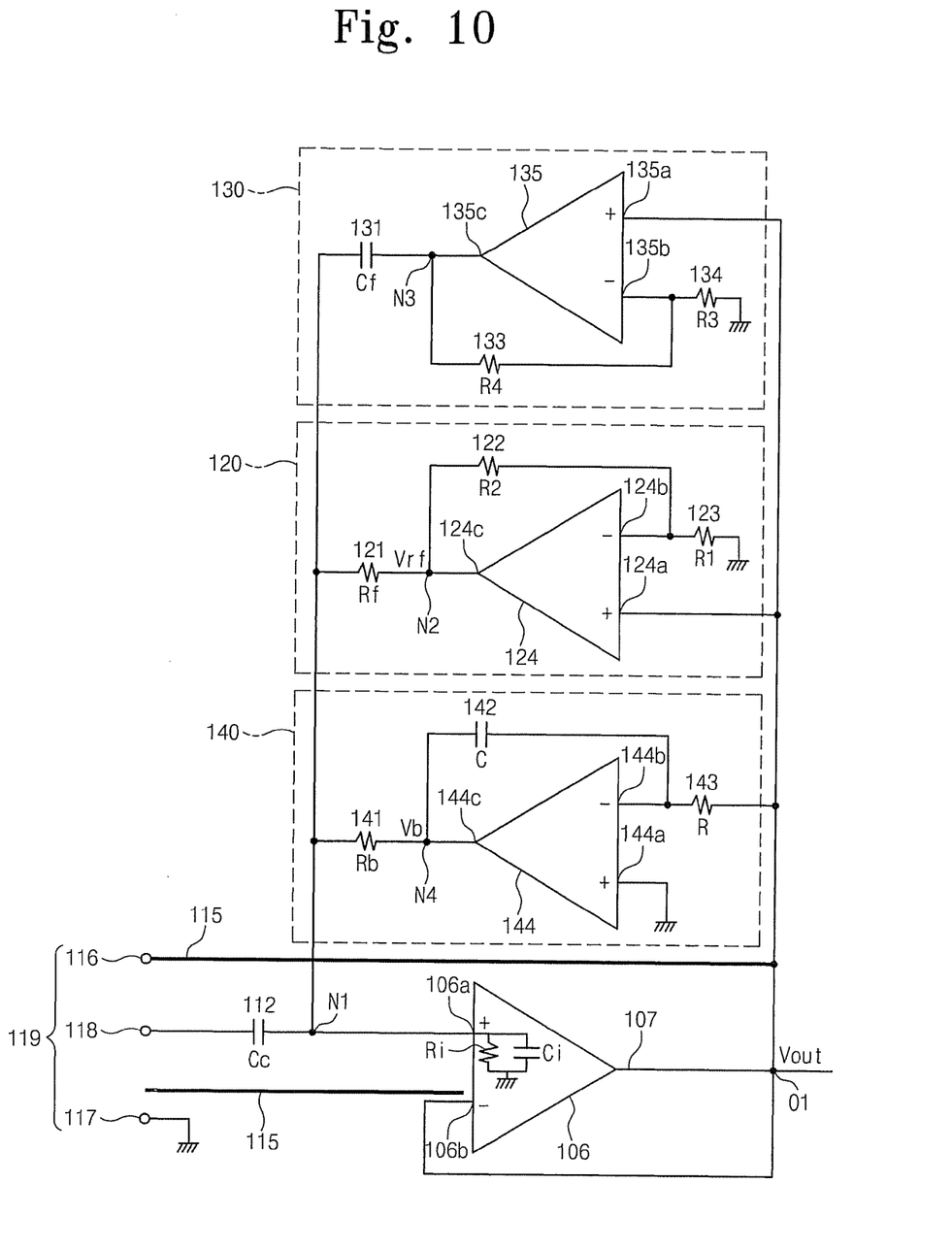
FIG. 10 is a circuit diagram of a sensor circuit according to another embodiment of the present invention.

FIG. 10 is a circuit diagram of a sensor circuit according to another embodiment of the present invention.

Referring to FIG. 10, the sensor circuit may include a first amplifier 106 receiving a measurement signal from an input terminal, amplifying the measurement signal, and providing the amplified signal to a first output terminal of the first amplifier, a first current source 120 supplying current $I_r$, flowing to a self input resistor $R_i$ of the first amplifier 106, a second current source 130 supplying current $I_c$ flowing to a self input capacitor $C_i$ of the first amplifier 130, and a bias current source 140 removing DC offset voltage appearing at an output of the first amplifier 106. The sensor circuit may measure an electric potential of a measurement target without contact with the measurement target. The sensor circuit may include a measurement electrode (not shown) that is capacitively coupled to a measurement target having an electric potential, a coupling capacitor 112 that is serially connected between the measurement electrode and the input terminal, and a guard unit 115 surrounding the periphery of the coupling capacitor 112 and/or the measurement electrode and maintained at a voltage of the measurement signal.

The first amplifier 106 may include a first negative input terminal 106b and a first positive input terminal 106a which are connected to a measurement electrode capacitively coupled to the measurement target (not shown) generating a measurement signal. The first amplifier 106 may receive the measurement signal with the first positive input terminal 106a, amplify the received signal, and output the amplified signal to a first output terminal 107. The coupling capacitor 112 may be placed between the measurement electrode and the first positive input terminal 106a of the first amplifier 106. A capacitance $C_c$ of the coupling capacitor 112 may be smaller than an equivalent capacitance $C_s$ built by the measurement target and the measurement electrode. The first negative input terminal 106b of the amplifier 106 may be connected to the first output terminal 107. A first node N1 may be disposed between the coupling capacitor 112 and the first positive terminal 106a.

The first current source 120 may be placed between the first node N1 and the first output terminal 107 of the first amplifier to increase an equivalent input resistance $R_{ie}$ of the sensor circuit. The second current source 130 may be placed between the first node N1 and the first output terminal 107 of the first amplifier 106 to decrease an equivalent input capacitance $C_{ie}$ of the sensor circuit. The bias current source 140 may be placed between the first node N1 and the first output terminal 107 to provide a stable operation of the first amplifier 106. The guard unit 115 may surround the periphery of the coupling capacitor 112 and/or the measurement electrode and may be connected to the first output terminal 107.

The first current source 120 may include a feedback resistor ($R_f$) 121 placed between the first node N1 and a second node N2, a second amplifier 124 with a second output terminal 124c connected to the second node N2, a first resistor (R1) 123 placed between a second negative input terminal 124b of the second amplifier 124 and a ground, and a second resistor (R2) 122 placed between the second node N2 and the second negative input terminal 124b of the second amplifier 124. A second positive input terminal 124a of the second amplifier 124 may be connected to the first output terminal 107 of the first amplifier 106. The first current source 120 may form one positive feedback circuit with non-inverting amplifier.

The second current source 130 may include a feedback capacitor ($C_f$) 131 placed between the first node N1 and a third node N3, a third amplifier 135 with a third output terminal 135c connected to the third node N3, a third resistor (R3) 134 placed between the third negative input terminal 135b of the third amplifier 135 and a ground, and a fourth resistor (R4) 133 placed between the third node N3 and a third negative input terminal 135b of the third amplifier 135. A third positive input terminal 135a of the third amplifier 135 may be connected to the first output terminal 107 of the first amplifier 106. The second current source 130 may form the other positive feedback circuit with non-inverting amplifier.

The bias current source 140 may include a bias resistor $R_b$ placed between the first node N1 and a fourth node N4, a fourth amplifier 144 with a fourth output terminal 144c connected to the fourth node N4, a capacitor (C) 142 placed between the fourth node N4 and a fourth negative input terminal 144b of the fourth amplifier 144, and a resistor (R) 143 placed between the fourth negative input terminal 144b of the fourth amplifier 144 and the first output terminal 107 of the first amplifier 106. A fourth positive input terminal 144a of the fourth amplifier 144 may be connected to a ground. The bias current source 140 may form a negative feedback with an integration circuit.

The guard unit 115 may be connected to a guard connection terminal 116 disposed at the periphery of a signal input terminal 118 and to the first output terminal 107 of the first amplifier 106 to be maintained at the voltage of the measurement signal. The guard connection terminal 116 may function as a guard of a measurement electrode (not shown) for signal detection. An input terminal unit 119 may include the signal input terminal 118, a reference ground terminal 117, and the guard connection terminal 116. The input terminal unit 119 may be configured to easily mount a measurement electrode.

As described above, a sensor circuit according to an embodiment of the present invention provides a guide for an amplifier design. A method of increasing an equivalent input resistance of the sensor circuit, a method of decreasing an equivalent input capacitance, and a bias method for a normal operation of the amplifier are provided. Thus, the sensor circuit may provide non-contact signal measurement for various signal sources. Particularly in bioelectrical signal measurement, a signal may be measured in a non-contact type without an electrolyte electrode.

Since the non-contact bioelectrical signal measurement may overcome disadvantages of a contact bioelectrical signal measurement method, it may make a great contribution to revitalization of a measurement apparatus and industrialization in a bioelectrical signal measurement field.

The sensor circuit according to an embodiment of the present invention provides a theoretical and practical method of measuring a bioelectrical signal, such as an electroencephalogram (EEG) or/and an electrocardiogram (ECG), without contacting an electrode with the skin.

The sensor circuit according to an embodiment of the present invention may be used as a non-contact sensor measuring not only a bioelectrical signal but also all electrical signals.

The sensor circuit according to an embodiment of the present invention may increase its self input resistance (infinity in theory) and decrease its self input capacitance (0 in theory) to measure potential of a measurement target without physical and electrical contact with the measurement target.

The sensor circuit according to an embodiment of the present invention may include a metal measurement electrode coated with an electrical insulator, a coupling capacitor connected in series to the measurement electrode, an amplifier connected in series to the coupling capacitor, and feedback circuits providing current feedback to an input of the amplifier.

The sensor circuit according to an embodiment of the present invention may include a feedback circuit for increasing an input resistance (infinity in theory). The feedback circuit may provide one positive current feedback to the input of the amplifier with predetermined gain for the output voltage of the amplifier.

The sensor circuit according to an embodiment of the present invention may include a feedback circuit for decreasing an input capacitance (0 in theory). The feedback circuit may provide the other positive current feedback to the input of the amplifier with differentiating the output voltage of the amplifier.

The sensor circuit according to an embodiment of the present invention may include a feedback circuit providing a bias for a stable operation of the sensor circuit. The feedback circuit may provide a negative current feedback to the input of the amplifier with integrating the output voltage of the amplifier.

In case of being constructed at a printed circuit board (PCB), the sensor circuit may include a guard unit surrounding an input terminal, a coupling capacitor, and a measurement electrode of the amplifier to reduce leakage current of a circuit input terminal.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative. Thus, the scope of the present invention is to be determined by the broadest permissible interpretation of the following claims and their equivalents, and shall not be restricted or limited by the foregoing description.

What is claimed is:

1. A sensor circuit comprising:
a first amplifier receiving a measurement signal with an input terminal, amplifying the received signal, and outputting the amplified signal to a first output terminal of the first amplifier;
a first current source comprising a non-inverting second amplifier connected between the first output terminal and the input terminal of the first amplifier, the first current source being configured for providing current flowing to a self input resistor of the first amplifier;
a second current source providing current flowing to a self input capacitor of the first amplifier, wherein the second current source comprises a non-inverting third amplifier connnected between the first output terminal and the input terminal of the first amplifier; and
a bias current source removing a DC offset voltage appearing at an output of the first amplifier, wherein the bias current source comprises an inverting fourth amplifier connected between the first output terminal and the input terminal of the first amplifier.

2. The sensor circuit as set forth in claim 1, further comprising at least one of:
a measurement electrode capacitive coupled to a measurement target having an electric potential;
a coupling capacitor coupled in series between the measurement electrode and the input terminal; and
a guard unit surrounding the periphery of the coupling capacitor and/or the measurement electrode and maintained at a voltage of the measurement signal.

3. The sensor circuit as set forth in claim 1, wherein a gain of the first amplifier is 1 or greater.

4. The sensor circuit as set forth in claim 1, further comprising:
a measurement electrode capacitive coupled to a measurement target having an electric potential;
a coupling capacitor coupled in series between the measurement electrode and the input terminal; and
a guard unit surrounding the periphery of the coupling capacitor and/or the measurement electrode and maintained at a voltage of the measurement signal.

5. The sensor circuit as set forth in claim 4, wherein a surface of the measurement electrode is coated with an insulator.

6. The sensor circuit as set forth in claim 4, wherein a capacitance of the coupling capacitor is smaller than an equivalent capacitance between the measurement target and the measurement electrode.

7. The sensor circuit as set forth in claim 1, wherein the first current source increases an equivalent input resistance of the sensor circuit.

8. The sensor circuit as set forth in claim 1, wherein the second current source decreases an equivalent input capacitance of the sensor circuit.

9. The sensor circuit as set forth in claim 1, wherein the bias current source provides a stable operation of the first amplifier.

10. The sensor circuit as set forth in claim 1, wherein the first current source comprises a non-inverting amplifier circuit and the first current source builds one positive feedback of the sensor circuit.

11. The sensor circuit as set forth in claim 1, wherein the second current source includes a differentiation circuit and a non-inverting amplifier circuit, and the second current source builds the other positive feedback of the sensor circuit.

12. The sensor circuit as set forth in claim 1, wherein the bias current source includes an integration circuit and an inverting amplifier circuit, and the bias current source builds a negative feedback of the sensor circuit.

13. The sensor circuit as set forth in claim 1, wherein the first amplifier comprises at least one of an operational amplifier, a transistor amplifier circuit, and a field effect transistor amplifier circuit.

14. A sensor circuit comprising:
a first amplifier receiving a measurement signal with an input terminal, amplifying the received signal, and outputting the amplified signal to a first output terminal of the first amplifier;
a first current source comprising a non-inverting second amplifier connected between the first output terminal and the input terminal of the first amplifier, the first current source being configured for providing current flowing to a self input resistor of the first amplifier;
a second current source providing current flowing to a self input capacitor of the first amplifier; and
a bias current source removing a DC offset voltage appearing at an output of the first amplifier,
wherein the non-inverting second amplifier comprises a negative input terminal, a positive input terminal, and a second output terminal connected to a node;
wherein the first current source comprises:
a feedback resistor placed between the input terminal and the node;
a first resistor placed between the negative input terminal of the second amplifier and a ground; and
a second resistor placed between the node and the negative input terminal of the second amplifier, and
wherein the positive input terminal of the second amplifier is connected to the first output terminal of the first amplifier.

15. A sensor circuit comprising:
a first amplifier receiving a measurement signal with an input terminal, amplifying the received signal, and outputting the amplified signal to a first output terminal of the first amplifier;
a first current source providing current flowing to a self input resistor of the first amplifier;
a second current source comprising a non-inverting second amplifier connected between the first output terminal and the input terminal of the first amplifier, the second current source being configured for providing current flowing to a self input capacitor of the first amplifier; and
a bias current source removing a DC offset voltage appearing at an output of the first amplifier,
wherein the non-inverting second amplifier comprises a negative input terminal, a positive input terminal, and a second output terminal connected to a node;
wherein the second current source comprises:
a feedback capacitor placed between the input terminal and the node;
a first resistor placed between the negative input terminal of the second amplifier and a ground; and
a second resistor placed between the node and the negative input terminal of the second amplifier, and
wherein the positive input terminal of the second amplifier is connected to the first output terminal of the first amplifier.

16. A sensor circuit comprising:
a first amplifier receiving a measurement signal with an input terminal, amplifying the received signal, and outputting the amplified signal to a first output terminal of the first amplifier;
a first current source providing current flowing to a self input resistor of the first amplifier;
a second current source providing current flowing to a self input capacitor of the first amplifier; and
a bias current source comprising an inverting amplifier connected between the first output terminal and the input terminal of the first amplifier, the bias current source being configured for removing a DC offset voltage appearing at an output of the first amplifier.

17. The sensor circuit as set forth in claim 16, wherein the inverting amplifier comprises a second amplifier with a negative input terminal, a positive input terminal, and a second output terminal connected to a node;
wherein the bias current source comprises:
a bias resistor placed between the input terminal and the node;
a capacitor placed between the node and the negative input terminal of the second amplifier; and
a resistor placed between the negative input terminal of the second amplifier and the first output terminal, and
wherein the positive input terminal of the second amplifier is connected to a ground.

* * * * *